United States Patent [19]
Dumas

[11] 3,955,104
[45] May 4, 1976

[54] SYNCHRONOUS CONTROL DEVICE FOR A STATIC RELAY BY A HIGH FREQUENCY SIGNAL

[75] Inventor: Guy H. Dumas, Paris, France

[73] Assignee: Silec-Semi-Conducteurs, Paris, France

[22] Filed: Nov. 19, 1974

[21] Appl. No.: 525,111

[30] Foreign Application Priority Data
Nov. 30, 1973 France .............................. 73.42862

[52] U.S. Cl. .......................... 307/252 UA; 307/320
[51] Int. Cl.² ......................................... H03K 17/60
[58] Field of Search ...................... 307/252 UA, 320

[56] References Cited
UNITED STATES PATENTS

| | | | |
|---|---|---|---|
| 3,324,355 | 6/1967 | Gessner et al. ................. | 307/252 N |
| 3,582,684 | 6/1971 | Gregson ....................... | 307/252 UA |
| 3,745,379 | 7/1973 | Gross ........................... | 307/252 UA |

Primary Examiner—Harold A. Dixon
Attorney, Agent, or Firm—Roylance, Abrams, Berdo & Kaul

[57] ABSTRACT

This invention relates to a synchronous device for a static relay by a high frequency signal.

According to this invention, a high frequency alternating signal source is serially connected with a diode between the anode $a$ and the gate $g$ of a thyristor, the main terminals $a$ and $b$ of which are connected to the terminals of a charge and supply circuit. The thyristor can be triggered only when the voltage between these terminals is lower than a threshold value and control signal is provided for high frequency source. The invention also provides for high frequency synchronous control methods for bidirectional devices.

The invention is applicable to a very simple and cheap control system of static relays.

9 Claims, 9 Drawing Figures

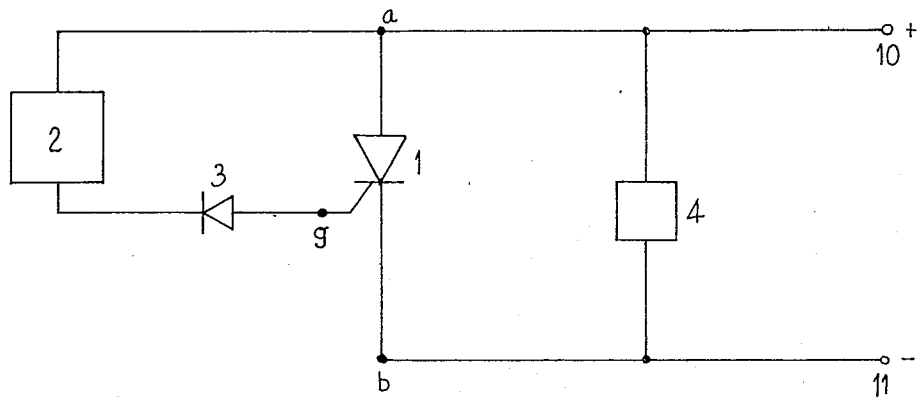
Fig. 1
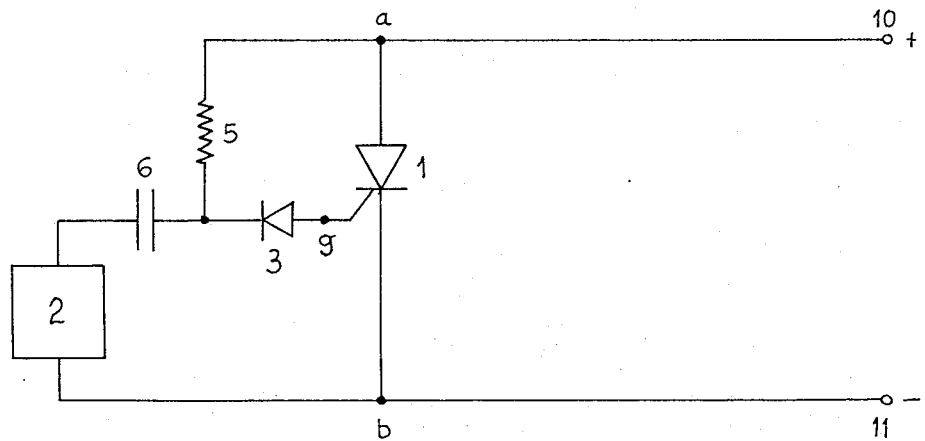
Fig. 2A
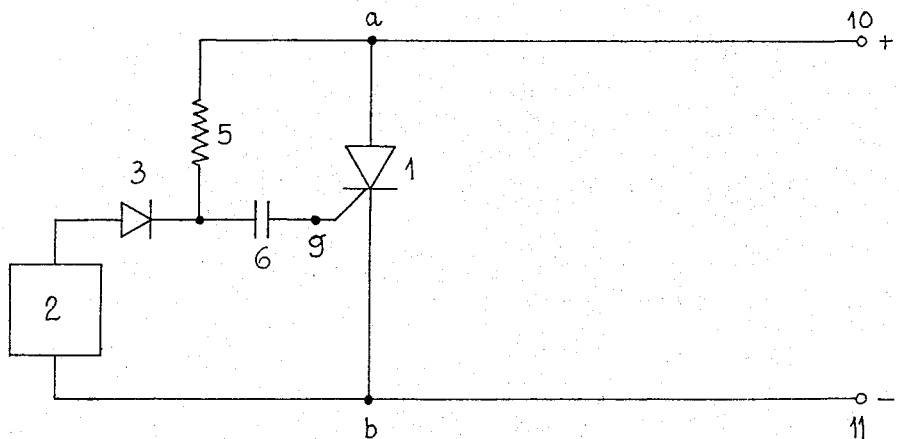

3,955,104

SYNCHRONOUS CONTROL DEVICE FOR A STATIC RELAY BY A HIGH FREQUENCY SIGNAL

BACKGROUND OF THE INVENTION

1. Field of the Invention

This invention relates to a method and device for the synchronous control of a static relay by an high frequency signal, that is a signal having a frequency which is high with respect to the frequency of the mains.

2. Description of the Prior Art

A synchronous switch is a static device adapted to open or to close a charge circuit fed by a rectified alternating or alternating power supply, in synchronism with a voltage passing a determined value close to a zero value and in relationship with a control signal. In other words, the invention aims at synchronizing the triggering of the switch in order that its operation (closure or opening of a circuit) takes place at times when the instant power is relatively very low. For this purpose, the switch control is determined in order to satisfy the following conditions:

closing close to the time of the first zero passing of the feed voltage which follows the closing order, holding the closed state until the current becomes nul even if the closing order has been suppressed or if the voltage at the terminals of the switch increases above the threshold value, opening of the circuit close to the time of the zero passing of the current and automatic re-closing immediately after this time as long as the closing order is maintained; or holding of the open state of the circuit if the closing order is suppressed until the time of the first zero passing of the feed voltage which follows the possible re-application of a closing order.

Conventionally, in case the main current to be switched is a rectified alternating current, unidirectional switches of the "thyristor" type are used, and in case the feed voltage to be switched is an alternating voltage, either an unidirectional switch of the thyristor kind associated with a full-wave rectifier, or two unidirectional switches of the "thyristor" type connected in an antiparallel manner, or a bidirectional switch of the triac type is used.

SUMMARY OF THE INVENTION

A first object of this invention is to provide for anyone of those types of switch, a new and very simple synchronous control method.

Another object of this invention is to provide a control device for a static switch operating with a control voltage having a very high frequency with respect to the frequency of the mains.

For achieving those objects, this invention provides to connect the main switch gate to a high frequency alternating control signal source, this connection being made through a means having an impedance variable according to the absolute value of the mains voltage, whereby the control signal operates efficiently on the gate of the main switch when the instant mains voltage is very low and that it becomes inoperative in view of its attenuation when the instant mains voltage becomes high. The variable impedance means can be a diode which has a very low impedance when it is forward biased and a high capacitive impedance when it is reverse biased, the capacitance decreasing quickly when the reverse voltage increases.

This control device according to the invention has especially the following advantage:

its construction is very simple and cheap;

the control signal source is practically disconnected from the charge circuit at the times when there is no triggering, which causes a lowering of the necessary control power;

the variable impedance, which is preferencially comprised of a diode reverse biased by the rectified mains voltage, can be adapted to the input characteristics of the thyristor in a way which is substantially independent from the temperature and the environment;

the control circuits do not cause any substantial parasitic current at low frequency in the main circuit which allows a very high resistor to be maintained at the terminals of the main switch when it is open.

BRIEF DESCRIPTION OF THE DRAWINGS

Those objects, characteristics and advantages and others will be disclosed in details in the following disclosure of preferred embodiments of this invention made in relationship with the attached drawings in which:

FIG. 1 shows a first embodiment of the invention,

FIGS. 2A and 2B show a second embodiment of this invention,

DESCRIPTION OF THE PREFERRED EMBODIMENTS

Figure 3A:
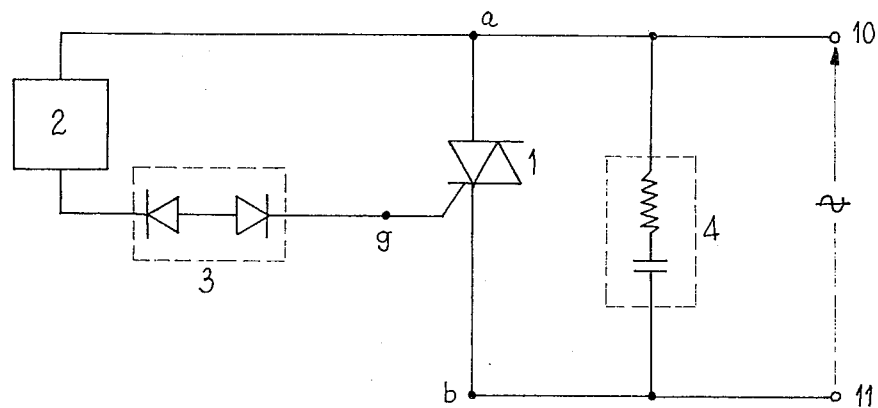
FIGS. 3A and 3B show applications of the first and second embodiments respectively in the case the control switch is a bidirectional semi-conductor device.

FIG. 1 shows a preferred embodiment of this invention wherein a switch device comprising a controlled unidirectional semi-conductor 1 (for example a thyristor) has its main terminals $a$ and $b$ connected to the terminals 10 and 11 respectively of a rectified alternating charge and supply circuit. The synchronous control device, connected between the terminal $a$ and the control terminal $g$ (gate) of the device 1 comprises a high frequency control signal source 2 and a device 3 having a capacitance which is dependent on the applied bias voltage. According to a preferred embodiment, this device 3 is a diode connected for preventing a direct current from flowing in the direction which would cause the triggering of the thyristor 1. If the instantaneous voltage of the terminals of the mains is called V, that is the voltage between the terminals 10 and 11, and the alternating voltage having a high frequency with respect to the frequency of the mains is called $V_1$, the diode 3 is equivalent to a capacitor C which decreases with the voltage $V_1$ at its terminals according to the following relation:

$$C = C_0 \left(\frac{V_0}{V+V_0}\right)^{1/x}$$

$C_0$ being the capacitance of the diode 3 for $V = 0$, $V_0$ being the electrostatic contact potential of the junction (in the range of 0.6 to 0.9 volt) and $x$ being a number between 2 and 3 for usual diodes.

The circuit further comprises an element 4 arranged between the terminals $a$ and $b$ which allows the high frequency current from the high frequency source to find a closed path through the gate junction of the thyristor 1. This element 4 can be a diode (or a set of serially connected diodes) arranged in an antiparallel manner with the main unidirectional semi-conductor switch 1 or simply a capacitor. It will be appreciated that in a practical application wherein the unidirectional switch 1 is used in a diagonal of a rectifier bridge, the other diagonal of which is connected to an alternating charge circuit, the rectifier bridge diodes constitute themselves this element 4. The control signal source 2 can be insulated from the rectified voltage applied between the terminals 10 and 11 by means of a transformer, or by connecting between the source 2 and the point $a$, a capacitor or another diode connected as the diode 3 for being blocked by the rectified voltage. With respect to the control circuit of the thyristor gate 1, this other diode is serially connected with the diode 3 and has the same function.

If we assume for the sake of simplicity that a number $n$ of diodes is serially connected in the high frequency current network, and those diodes are all identical and that the internal impedance of the high frequency source 2 is negligible, the current crossing the gate-cathode junction of thyristor 1 is given by the hereunder formula:

$$I = \frac{C_0 \omega V_1}{n} \left[ \frac{V_0}{V + V_0} \right]^{1/x}$$

$V_1$ and $\omega$ being the amplitude and the angular frequency of the high frequency source respectively. It will be understood that if the high frequency is in the range of the MHz, the value of $C_0$ can be in the range of only some tens of picofarads.

The triggering of the thyristor 1 takes place when the current $I$ provides on the part $k$ of the capacitance $C_t$ of the gate-cathode junction $gb$ of the thyristor 1 a voltage $V_g$ greater than a given value (about 0.6 volt). Accordingly the triggering takes place only for instantaneous values of $V$ lower than a threshold value $V_S$ such that:

$$\frac{V_s}{V_0} = \left[ \frac{nkC_t}{C_0} \cdot \frac{V_1 - V_g}{V_g} \right]^x - 1$$

Once the surfaces and the concentrations of the thyristor junction diodes are selected, the ratio $C_0/nkC_t$ is determined, and the threshold voltage $V_S$ is mainly determined by the amplitude $V_1$ of the control voltage. The adjustment of this amplitude $V_1$ is thus a practical and sensitive means for adjusting the zero voltage switching accuracy.

For example, with two diodes having a high breakdown voltage and high current, of the "controlled avalanche" type, for which $x$ is close to 2.3 and each one having a capacitor $C_0 = \frac{1}{8}$ of the input capacitor $C_t$ of the thyristor, it results $C_0/nkC_t = \frac{1}{8}$ by assuming that $k = \frac{1}{2}$ and the threshold voltage is 0 for $V_1 =$ about 5 volts and 8,5 volts for $V_1 =$ about 15 volts. It should be understood that according to this invention, the threshold voltage can be as close to zero as it is desired.

According to an alternative aspect of this invention, the variable impedance device 3 is always equivalent to an open circuit for the direct current and to a low or high impedance device for a high frequency alternating current if the applied voltage by said direct current is low or high respectively. The variation speed of the impedance value in relationship with the bias voltage will determine the accuracy of the zero voltage switching.

It will be understood that the device shown in FIG. 1 can be submitted to numerous detail alterations without departing from the scope of this invention. Particularly the gate and the cathode of the thyristor 1 can be connected through a resistor or a low capacity anti-parallel diode for eliminating the stored charge on the capacitors of the diodes 3 and 4 by the mains voltage. Strictly speaking, the previously mentioned equations are exact only when the low capacitance diode is connected between the terminals $g$ and $b$, its anode being in $b$ and its cathode in $g$, for eliminating the rectifying effects of the junction $gb$.

On the contrary, when a resistor having a value equivalent to the impedance $1/C_t \omega$ is connected between $g$ and $b$, the hereover mentioned equations are no longer theoritically accurate. The inventor has, however, shown that the values of the capacitor $C_0$ remain always practically correct in this case. When this resistor is present, it is necessary to increase a little the control power but this resistor has the following advantage:

improvement of the insensitivity to parasitic voltage peaks and, equalization of the $V_S$ values when thyristor 1 and diodes 3 having unequal characteristics are used.

FIG. 2A shows a second embodiment of this invention adapted to provide a better isolation of the control circuit with respect to the possible parasitic voltage peaks in the mains circuit thereby avoiding more efficiently spurious triggering of the thyristor 1. If, as hereinabove $a$, $b$ and $g$ refer respectively to the main electrodes and the gate of thyristor 1, the control circuit comprises a diode 3, the first terminal of which is connected with the gate $g$ of the thyristor 1 and the second terminal of which is connected on the one hand to the anode of the thyristor 1 through a resistor 5, and on the other hand to its cathode through a capacitor 6 and the high frequency control signal source 2. The resistor 5 derives the feed voltage on the diode 3 in order to reverse the bias same. Thus if the source 2 has a low self-impedance, the voltage peaks between $a$ and $b$ will be very attenuated at the junction of the resistor 5 and the capacitor 6 and will have no practical influence on the gate $g$ of the thyristor 1.

As before, this embodiment can be subject to various detail alterations, especially as regards the addition of insulation capacitors and additional resistors or diodes for discharging the junction capacitors. In particular, the capacitor 6 can be replaced by a diode reverse biased by a rectified voltage between the terminals 10 and 11, when this rectified voltage is higher than the voltage of the control source.

A variant of this second embodiment is shown in FIG. 2B wherein the arrangement of the diode 3 and the capacitor 6 are symetrically interchanged. Accordingly, the diode 3 is reversebiased by the mains voltage $V$ when this one is higher than the value of the voltage V₁ from the control source, and is direct biased when V₁ is higher than the instant value V. According to this variant of the second embodiment, the triggering threshold value is:

$$V'_s = V_1 - V_j$$

$V_j$ being a junction voltage ($V_j$ = about 1 volt). It has to be noted that this second embodiment allows the use of a diode 3 having a very low capacitance.

In the two preceeding embodiments, the high frequency source 2 can be of any known type, but has preferably a low self-resistance and can for example include a high frequency source operating on the primary coil of a transformer, the secondary coil of which is connected with the terminals of the control circuit.

FIG. 3A shows an embodiment of this invention analogous to the embodiment disclosed with reference to FIG. 1, the controlled semi-conductor switch device 1 being now a bidirectional device of the triac type, and the variable capacitor device 3 comprising two serially connected diodes in opposition, in order that each of those diodes has no effect on one half cycle and has the effect of a variable capacitor on the other half cycle. The element 4 allows, as in FIG. 1, to close the high frequency circuit. This element 4 may comprise two opposed diodes or a series resistance-capacitor circuit, which circuit is usually arranged at the terminals of a triac for attenuating the possible parasitic voltage peaks.

Figure 3B:
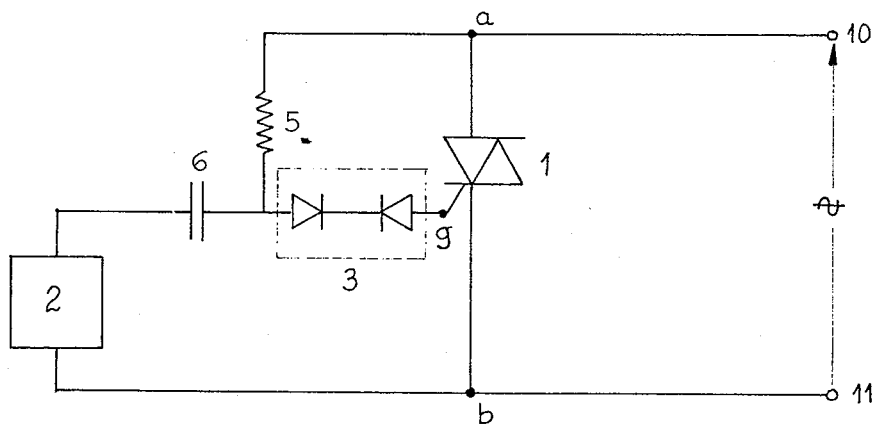

FIG. 3B shows also a variant of the second embodiment disclosed in connection with FIG. 2B, wherein the same changes have been done, that is the device 1 is a bidirectional device and the variable capacitor element 3 comprises two opposed serially connected diodes.

Figure 3C:
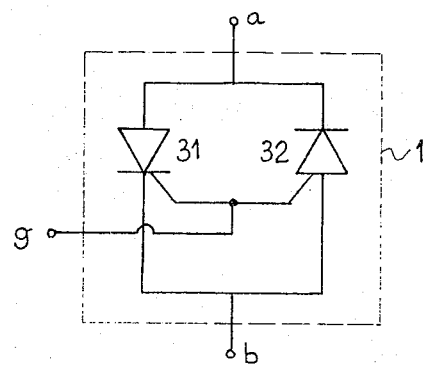
FIG. 3C shows a unidirectional switch arrangement equivalent to a bidirectional device.

It will be understood that in the cases of FIGS. 3A and 3B, the bidirectional semi-conductor switch device can be other than a triac, for example the device shown in FIG. 3C comprising two anti-parallel thyristors, one usual thyristor and an anode gate thyristor (or remote gate thyristor), the gates of which are interconnected.

Figure 4A:
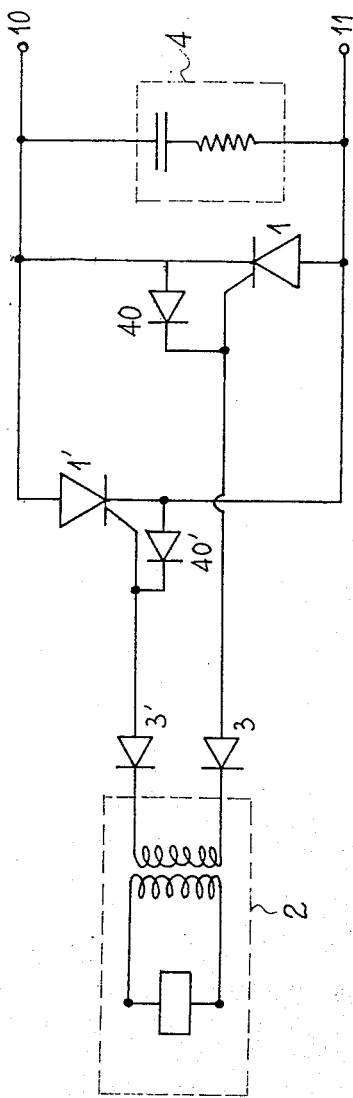
FIGS. 4A and 4B show applications of the first and second embodiments respectively in case two unidirectional semi-conductor devices of the thyristor type are used for achieving a bidirectional switch device.

FIG. 4A shows another variant of the first embodiment in which a combination of two circuits such as the one shown in FIG. 1, arranged in an anti-parallel manner, are used for a direct application to the terminals 10 and 11 of an alternating circuit. The cathodes and the gates of each of the thyristors 1 and 1' are connected by low capacitors diodes 40 and 40' respectively in order that the two thyristors 1 and 1' can be alternatively controlled.

Figure 4B:
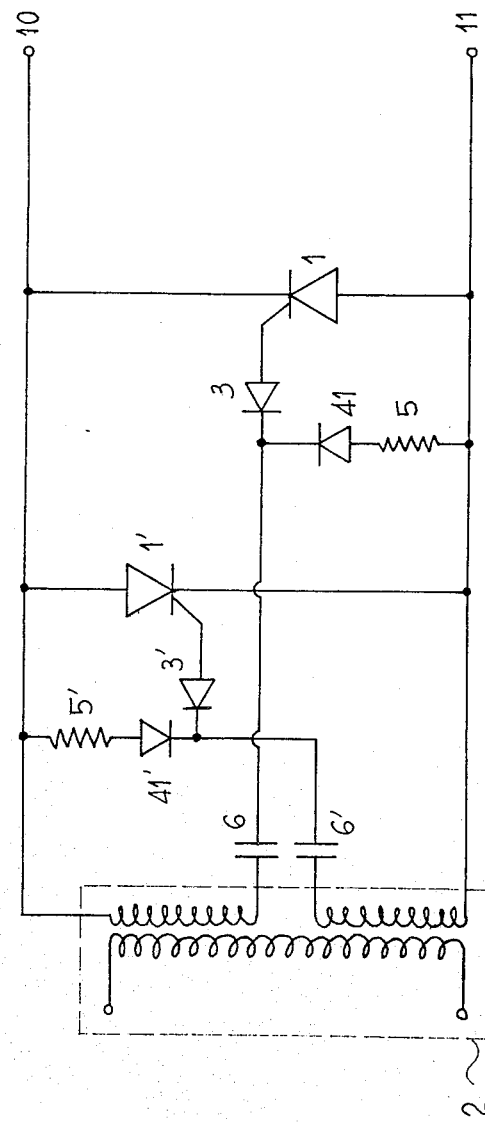

FIG. 4B shows a variant of the second embodiment in which two circuits such as the one of FIG. 2A are combined in an anti-parallel manner for permitting the synchronous control of alternating voltage at the terminals 10 and 11 of an alternating charge and supply circuit. Diodes 41 and 41' are serially connected with the resistors 5 and 5' respectively. Those diodes 41 and 41' prevent a low frequency current to pass through the resistors 5 and 5' when the polarity of the feed voltage is reversed.

The circuit of FIG. 4B can receive the same alterations as the ones of FIG. 2A, shown in FIG. 2B, that is that the capacitors 6 and 6' and the diodes 3 and 3' can be exchanged.

This invention can also apply to the control of two serially connected switches, for example to stand a feed voltage higher than the maximal voltage that only one switch can stand. The previously disclosed embodiments can be applied to each of the static switches separately or to the set of the two serial switches.

Figure 5:
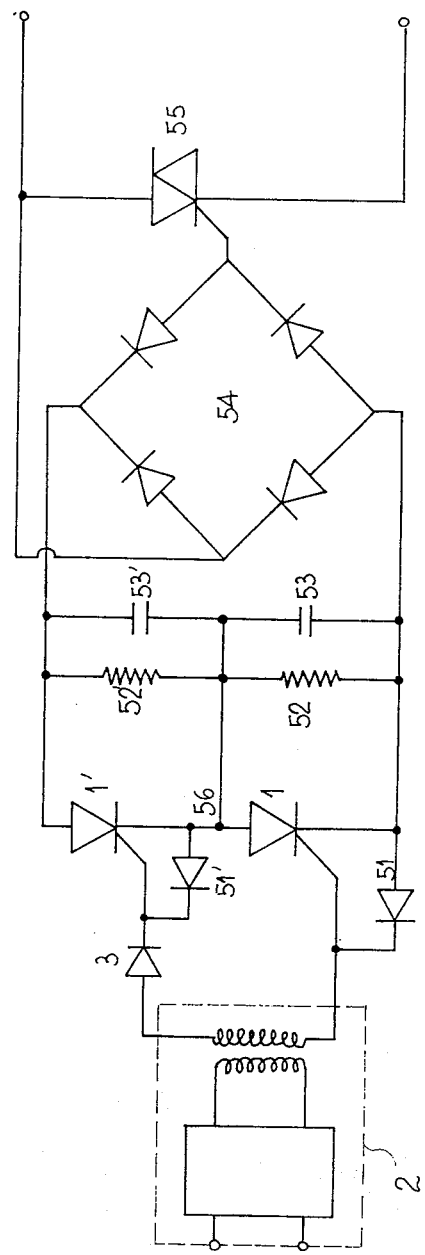
FIG. 5 shows an application of the combination of the first and second embodiments of this invention.

FIG. 5 shows an example of such an application wherein the two thyristors 1 and 1' serially connected are serially controlled by the source 2, the thyristor 1 being controlled according to the embodiment shown in FIG. 1 and the thyristor 1' according to the embodiment shown in FIG. 2B, by means of the diode 3 having for each of those thyristors the effect that it had in FIGS. 1 and 2B respectively. A resistor 52 and a capacitor 53 are respectively arranged in parallel with the main electrodes of the thyristor 1 and a resistor 52' and a capacitor 53' are also arranged in parallel between the main electrodes of the thyristor 1'. The anode of the thyristor 1' and the cathode of the thyristor 1 are connected to a diagonal of a rectifier bridge 54, the other diagonal of which is used to control a triac 55 which has its main terminals connected to a charge and supply circuit. The diode 3 is in a blocking state (reverse bias) as long as the voltage at the junction 56 of the thyristors 1 and 1' is high. When this voltage decreases under the control signal amplitude V₁ (disregarding two junction voltages) the high frequency current can flow in the direct direction of the diode 3 (through the capacitor 53 and the input capacitance of the thyristor 1) for triggering the thyristor 1', and in the reverse direction of the diode 3 for triggering the thyristor 1.

A low capacitance diode 51' can be added in an anti-parallel manner at the terminals of the gate junction of the thyristor 1' for facilitating the flow of the current triggering the thyristor 1. The triggering of the latter provides a low impedance path for closing the control current of the thyristor 1'. Also a low capacitor diode 51 can be added in an anti-parallel manner on the gate junction of the thyristor 1. Resistors can also be added in parallel on the gate-cathode junctions of the two thyristors as this has been hereinover indicated with reference to the preferred embodiments of this invention.

It will be understood that the control method of the invention can be used for many other arrangements of main switches, especially in case of a synchronous control for multiphased current switches in which the control method according to this invention is clearly adapted to the conventional arrangement of a main unidirectional switch associated with a diode connected in an anti-parallel manner on its main terminals arranged on each phase of the mains.

It is not intended that the invention be limited solely to those disclosed embodiments. Instead, many modifications will occur to those skilled in the art which lie within the spirit and scope of the invention.

What is claimed is:

1. A synchronous control circuit for a static switch comprising
    a serial connection comprising a high frequency source, a capacitor, and an element having a variable impedance for the high frequency current according to the instantaneous bias voltage value at its terminals, connected to the control terminals of the static switch;
    a resistor connected between a terminal of this serial connection and the supply voltage for biasing said variable impedance element in the direction which increases its impedance for the high frequency signals when the absolute value of the supply voltage increases.

2. A synchronous control circuit for a static switch according to claim 1 wherein the static switch is unidirectional and said variable impedance element is a diode.

3. A synchronous control circuit for a static switch according to claim 1 wherein the static switch is bidirectional and said variable impedance element comprises two opposed serial diodes.

4. A synchronous control circuit for a gate-controlled semiconductor switch of a type having two main electrodes which are connected with a supply and load circuit fed at a first frequency, said synchronous control circuit comprising a control signal source generating a voltage at a second frequency which is high with respect to said first frequency;

circuit means connected to the supply voltage for developing a biasing voltage; and a two-terminal variable capacitance means connected to said circuit means and in series circuit relationship with said control signal source between the gate-electrode and the main electrode opposite to said gate-electrode of said semiconductor switch for providing a very high impedance at the first frequency when the biasing voltage simultaneously applied at the first frequency is high, a low impedance at the second frequency when the biasing voltage simultaneously applied at the first frequency is low, whereby the semiconductor switch can be triggered into conduction only when the voltage in the load circuit is low.

5. A synchronous control circuit according to claim 4 wherein said variable capacitor means comprises a rectifying diode connected in a direction which prevents the semiconductor switch from being triggered by a low frequency signal.

6. A synchronous control circuit according to claim 5 wherein said diode is selected to have a capacitance $C_0$ in the order of 1/10th of the value of the input capacitance C of said semiconductor switch when the instant voltage of the load circuit is close to zero, and a much lower capacitance when the voltage of the load circuit increases.

7. A synchronous control circuit according to claim 5 wherein said semiconductor switch is a thyristor to the main electrodes of which is applied a rectified supply voltage, the variable capacitance means being a rectifying diode with a high breakdown voltage, and the active area of the diode being in the same range of size as the active area of the cathode junction of the thyristor.

8. A synchronous control device according to claim 4 wherein said semiconductor switch is a triac to the main electrodes of which is applied an alternating supply voltage, and wherein the variable capacitance means consists of two rectifying diodes connected in series opposition.

9. A synchronous control circuit according to claim 4 wherein said variable capacitance means comprises a plurality of serially connected rectifying diodes mounted in a direction which prevents the semiconductor switch from being triggered by a low frequency signal.

* * * * *